(12) United States Patent
Kushibiki et al.

(10) Patent No.: US 7,604,908 B2
(45) Date of Patent: Oct. 20, 2009

(54) FINE PATTERN FORMING METHOD

(75) Inventors: Masato Kushibiki, Nirasaki (JP); Akitaka Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 583 days.

(21) Appl. No.: 11/370,149

(22) Filed: Mar. 8, 2006

(65) Prior Publication Data
US 2006/0204899 A1 Sep. 14, 2006

Related U.S. Application Data

(60) Provisional application No. 60/664,959, filed on Mar. 25, 2005.

(30) Foreign Application Priority Data
Mar. 9, 2005 (JP) ............................... 2005-064768

(51) Int. Cl.
G03F 1/00 (2006.01)
(52) U.S. Cl. ........................... 430/5; 430/311; 430/394; 438/9

(58) Field of Classification Search ..................... 430/5, 430/313
See application file for complete search history.

(56) References Cited

U.S. PATENT DOCUMENTS

| | | | | |
|---|---|---|---|---|
| 5,661,061 A | * | 8/1997 | Usuami et al. | 438/254 |
| 2003/0224617 A1 | * | 12/2003 | Baek et al. | 438/763 |
| 2006/0046200 A1 | * | 3/2006 | Abatchev et al. | 430/313 |

* cited by examiner

Primary Examiner—Mark F Huff
Assistant Examiner—Rashid Alam
(74) Attorney, Agent, or Firm—Oblon, Spivak, McClelland, Maier & Neustadt, L.L.P.

(57) ABSTRACT

A fine pattern forming method includes the first step of depositing a plasma reaction products on a sidewall of a patterned mask layer to increase a pattern width thereof, the second step of etching a first etching target layer by using as a mask the mask layer, the pattern width of which has been increased, the third step of filling with a mask material a space formed in the etched first etching target layer, the fourth step of etching the etched first etching target layer leaving the mask material filling the space, and the fifth step of etching a second etching target layer by using a remaining mask material as a mask.

12 Claims, 6 Drawing Sheets

FINE PATTERN FORMING METHOD

FIELD OF THE INVENTION

The present invention relates to a fine pattern forming method.

BACKGROUND OF THE INVENTION

In general, for manufacturing a semiconductor device, an etching process is performed to form a desired fine pattern on a thin film laminated on a semiconductor wafer (hereinafter, referred to as a 'wafer'). In the etching process, a photolithography technology is employed to form a fine pattern circuit. Specifically, on an etching target layer to be etched, a photoresist material is uniformly coated first and dried; and subsequently, an exposure treatment is carried out on the photoresist film to transfer a pattern such as a fine circuit or the like by irradiating thereon a light beam of a predetermined wavelength.

If the photoresist material is a positive type, a part of the photoresist film, to which the light beam has been irradiated, is removed by performing a developing process thereon to thereby form a patterned mask layer. Thereafter, a plasma etching process or the like is carried out on the etching target layer to form a desired pattern thereof by using the mask layer as a mask.

In the manufacture of the semiconductor device, wherein various patterns are formed by using the photolithography technology as mentioned above, integration and miniaturization of a pattern dimension have been ever progressing. For example, in the semiconductor device, each pattern dimension gets smaller as the design rule thereof becomes finer. Since, however, miniaturization depends on resolution in the photolithography technology, a dimension, which can be formed by the photolithography method is the micro-processing limit.

Recently, there has been proposed an exposure method using a KrF eximer laser (248 nm) or an ArF eximer laser (193 nm) as an exposure light source. However, even with this exposure method, only about 60 nm wide critical dimension (CD) in a single wire can be attained. Further, attempts have been made to use therewith an off-axis illumination or a phase shift method. In the off-axis illumination method, however, an exposure time gets longer and a throughput is reduced since a part of the light source is shielded. Further, although the phase shift method improves the resolution, it complicates the method for manufacturing the mask. To overcome these shortcomings, Japanese Patent Laid-open Application No. H08-45906 discloses a method for etching the resist film to obtain a desired pattern after performing an ion implantation.

As described above, while there have been adopted various methods for performing a micro-processing in the manufacture of the semiconductor device, only about 60 nm wide CD is the limit which can be achieved through the conventional processing methods. For example, in case of the MOSFET semiconductor device, an improvement in a performance can be achieved if the gate length is reduced. However, it is difficult to make the gate length 50 nm or less using the current exposure technologies.

SUMMARY OF THE INVENTION

The present invention is contrived on the basis of the aforementioned problems, and it is, therefore, an object of the present invention to provide a micro-processing method capable of providing a fine pattern.

In accordance with the present invention, there is provided a fine pattern forming method, including: the first step of depositing a plasma reaction products on a sidewall of a patterned mask layer to increase a pattern width thereof; the second step of etching a first etching target layer by using as a mask the mask layer, the pattern width of which has been increased; the third step of filling with a mask material a space formed in the etched first etching target layer; the fourth step of etching the etched first etching target layer leaving the mask material filling the space; and the fifth step of etching a second etching target layer by using a remaining mask material as a mask.

In accordance with this method, by etching a first etching target layer by using as a mask the mask layer, the pattern width of which has been increased, a narrow space can be formed in the first etching target layer. Further, by using a mask material filling the space as a mask, it is possible to form a narrow pattern in the second etching target layer to the same degree as the space formed in the first etching target layer.

In this method, the mask layer is formed of, for example, a photoresist material. The photoresist material may be photosensitive to an ArF light beam. Further, a processing gas in the first step may be, for example, any one of CF based gas, CHF based gas, and CH based gas. In case of using, for example, $CHF_3$ as the processing gas, the pattern width of the mask layer is increased efficiently in the first step. A width of the space can be, for example, 50 nm or less. Further, in the second step, an antireflection layer formed under the mask layer may be etched first, and then, the first etching target layer can be etched. In this case, an organic antireflection film can be employed. Further, in the third step, a deposit may be formed first to cover, for example, the first etching target layer, and then, the first etching target layer can be exposed by a CMP processing or an etchback processing. Further, in the third step, the mask material filling the space may be a different material from the first etching target layer. Further, the first etching target layer may be formed of the same material as the second etching target layer; and an etch-stop layer may be formed between the first and the second etching target layer. In that case, in the fifth step, the etch-stop layer formed under the first etching target layer may be removed first, and then, the second etching target layer may be etched. Further, each of the first and the second etching target layer may be formed of polycrystalline silicon, and the etch-stop layer may be formed of a silicon oxide film or a silicon nitride film. Further, the first etching target layer may be formed of a low dielectric constant film material, the second etching target layer may be formed of polycrystalline silicon, and the mask material may be formed of amorphous carbon. Further, the fine pattern forming method may further include the sixth step of removing the mask material, after the fifth step.

In accordance with the present invention, it is possible to form a fine pattern by forming a narrow mask using a narrow space.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings. Further, like reference numerals will be assigned to like parts having substantially same functions, and redundant description thereof will be omitted in the specification and the accompanying drawings.

Figure 1:
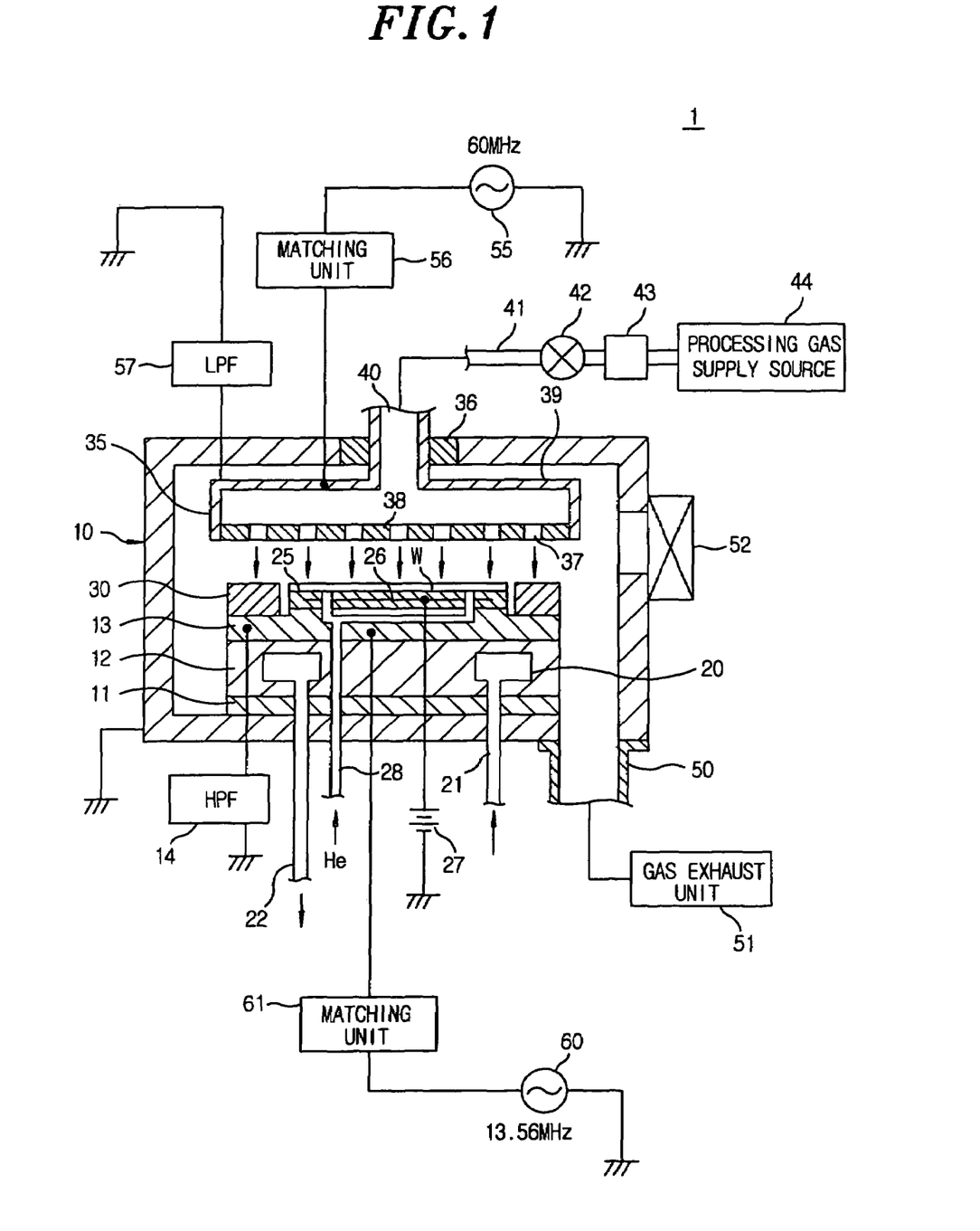
FIG. 1 offers a schematic configuration view of a plasma processing apparatus for performing a fine pattern forming method in accordance with a preferred embodiment of the present invention.

FIG. 1 shows a schematic configuration of a parallel plate type plasma processing apparatus 1 as one example of a plasma processing apparatus for performing a fine pattern forming method in accordance with the present embodiment.

The plasma processing apparatus 1 has a chamber (processing vessel) 10 made of, e.g., aluminum whose surface is anodically oxidized (alumite treated), the chamber 10 being grounded. At a bottom portion in the chamber 10, there is provided a susceptor supporting table 12 for mounting thereon a semiconductor wafer (hereinafter, referred to as a 'wafer') employed as a target object, with an insulating plate 11 made of a ceramic or the like located therebelow. A susceptor 13 constituting a lower electrode is provided on the susceptor supporting table 12. A high pass filter (HPF) 14 is connected to the susceptor 13.

Inside the susceptor supporting table 12, there is provided a temperature control medium space 20. Further, a temperature control medium is introduced into the temperature control medium space 20 through an inlet line 21 to be circulated therein, and discharged from an outlet line 22. With such a circulation of the temperature control medium, the susceptor can be regulated to have a desired temperature.

The susceptor 13 is formed to have a protruded circular plate shape in an upper central portion thereof, allowing an electrostatic chuck 25 of the substantially same shape as the wafer W to be provided thereon. The electrostatic chuck 25 is formed of an insulating member having therein an embedded electrode 26. To the electrostatic chuck 25, there is applied a DC voltage of, e.g., 2.5 kV, from a DC power supply 27 connected to the electrode 26. In this way, the wafer W is electrostatically adsorbed on the electrostatic chuck 25.

Further, through the insulating plate 11, the susceptor supporting table 12, the susceptor 13 and the electrostatic chuck 25, there is formed a gas channel 28 for supplying a heat transfer medium (e.g., a backside gas such as He gas or the like) to a backside surface of the wafer W employed as the target object. Heat is transferred between the susceptor 13 and the wafer W through the heat transfer medium, allowing the wafer W to be maintained at a predetermined temperature.

At an upper periphery portion of the susceptor 13, there is disposed a ring-shaped focus ring 30 to surround the wafer W mounted on the electrostatic chuck 25. The focus ring 30 is made of an insulating material such as ceramic or quartz, or a conductive material. By placing the focus ring 30, it is possible to improve an etching uniformity.

Further, an upper electrode 35 is provided above the susceptor 13, facing the susceptor 13 in pararrel thereto. The upper electrode 35 is supported in the chamber 10 through an insulating member 36. The upper electrode 35 is formed of an electrode plate 38 facing the susceptor 13 and having therein a plurality of injection openings 37; and an electrode supporting member 39 for supporting the electrode plate 38. The electrode plate 38 is made of, e.g., quartz, and the electrode supporting member 39 is made of a conductive material, e.g., aluminum whose surface is alumite treated. Further, a gap between the susceptor 13 and the upper electrode 35 is controlled.

A gas introduction port 40 is provided in the center of the electrode supporting member 39 of the upper electrode 35. A gas inlet line 41 is connected to the gas introduction port 40. Further, to the gas inlet line 41, there is connected a processing gas supply source 44 through a valve 42 and a mass flow controller 43.

An etching gas for a plasma etching is supplied from the processing gas supply source 44. Further, although in FIG. 1, there is shown only one processing gas supply system formed of the gas inlet line 41, the valve 42, the mass flow controller 43 and the processing gas supply source 44, the plasma processing apparatus provided with a plurality of such processing gas supply systems. For example, processing gases such as $CF_4$, $CHF_3$, $C_4F_8$, $N_2$, $O_2$, $Cl_2$, HBr, Ar and the like, respective flow rates of which are controlled independently, can be supplied into the chamber 10.

To the bottom portion of the chamber 10, there is connected a gas exhaust line 50, to which a gas exhaust unit 51 is connected. The gas exhaust unit 51 having a vacuum pump such as a turbo molecular pump or the like adjusts an inside of the chamber 10 at a predetermined depressurized atmosphere (e.g., 0.67 Pa or less). Further, a gate valve 52 is provided on a sidewall of the chamber 10. By opening the gate valve 52, the wafer W can be loaded into and unloaded from the chamber 10. Still further, the wafer W is transferred by using, e.g., a wafer cassette.

A first high frequency power supply 55 is connected to the upper electrode 35, and a first matching unit 56 is provided in the middle of a feeder line thereof. Further, a low pass filter (LPF) 57 is connected to the upper electrode 35. The first high frequency power supply 55 can output a power of a frequency in the range of 50~150 MHz. By applying such a high frequency power to the upper electrode 35, the inside of the chamber 10 can be in a preferable dissociation state and thus a high-density plasma can be formed, allowing a plasma processing to be performed under a low pressure condition compared to the prior art. A frequency of an output power of the first high frequency power supply 55 is preferably in the range of 50~80 MHz, and typically, adjusted at 60 MHz as illustrated in FIG. 1 or thereabout.

A second high frequency power supply 60 is connected to the susceptor 13 serving as the lower electrode, and a second matching unit 61 is placed in the middle of a feeder line thereof. The second high frequency power supply 60 can output a power of a frequency in the range from several hundreds of kHz to less than 20 MHz. By applying a power having such a range of frequency to the susceptor 13, a proper ionic action can be applied to the wafer W employed as a target object without damaging it. A frequency of an output power of the second high frequency power supply 60 is typically set at 13.56 MHz as illustrated in FIG. 1, 2 MHz or the like.

In the following, there will be explained, with reference to FIG. 2, a film layer structure of the wafer W employed as one example of a target object to be etched by using the plasma processing apparatus 1 shown in FIG. 1.

Figure 2:
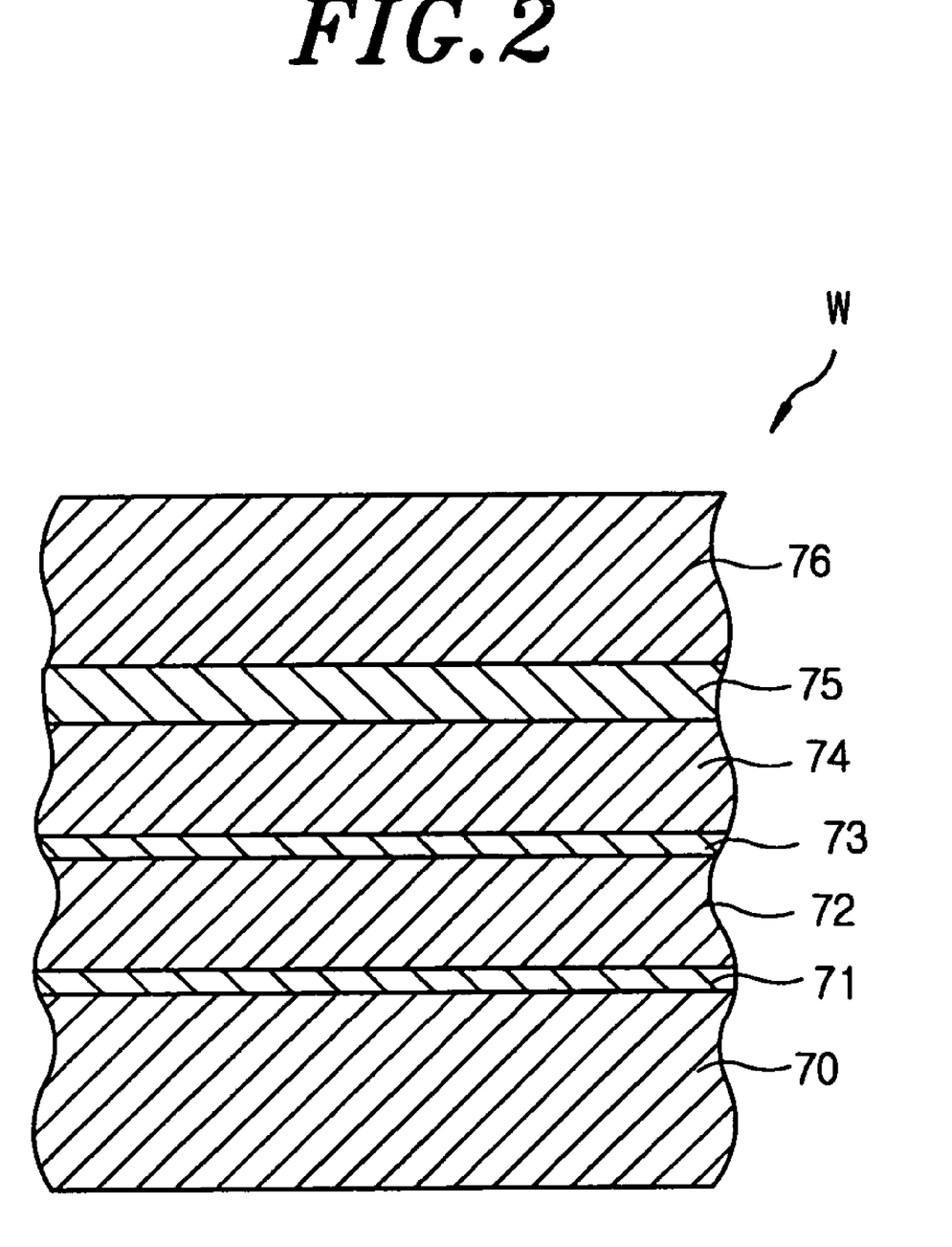
FIG. 2 provides a schematic configuration view showing a film structure of an object that will be subjected to an etching process by the plasma processing apparatus shown in FIG. 1.

As illustrated in FIG. 2, the wafer W employed as an etching target object in the present embodiment has an insulating layer 71, a second etching target layer 72 and an etch-stop layer 73, all of them being sequentially stacked on a silicon substrate 70; and, further, has a first etching target layer 74, an antireflection film 75 and a mask layer 76, all of them being sequentially laminated on the etch-stop layer 73.

The mask layer 76 is formed of a photoresist material, having a thickness of e.g., 200~260 nm. The photoresist material forming the mask layer 76 is photosensitive to, e.g., an ArF light beam having a wavelength of 193 nm.

The antireflection film (Bottom Anti-Reflecting Coating: BARC) 75 is disposed under the mask layer 76 to prevent a light beam from being reflected from a under layer by adsorbing the exposure light when the mask layer 76 is subjected to an exposure by using the ArF light beam or the like. By providing the antireflection film 75, finer pattern may be obtained. Further, a film thickness of the antireflection film 75 used herein is, e.g., 40~90 nm.

The first etching target layer 74 is formed of, e.g., polycrystalline silicon, and a thickness thereof is, e.g., 50~150 nm.

The etch-stop layer 73 formed of, e.g., TEOS (TetraEthyl OrthoSilicate) serves as an etch-stop layer when etching the first etching target layer 74. Further, a thickness of the etch-stop layer used herein is, e.g., 10~30 nm.

The second etching target layer 72 is formed of, e.g., polycrystalline silicon, and a thickness thereof is, e.g., 100~150 nm. Further, the insulating layer 71 is formed of, e.g., a silicon oxide film, and a thickness thereof is, e.g., 1~2 nm. For example, in case where a MOSFET transistor is manufactured using the wafer W, the second etching target layer 72 becomes a gate electrode and the insulating layer 71 becomes a gate oxide film.

The wafer W having the film layer structure as configured above is subjected to a photolithography processing prior to being etched by using the plasma processing apparatus 1. The photolithography processing is carried out on the mask layer 76 to generate, e.g., a line-and-space pattern in the mask layer 76.

Figure 3A:
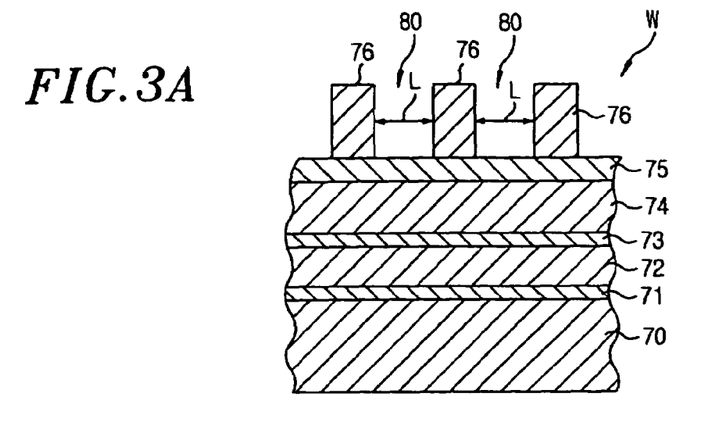
FIGS. 3A to 3K are explanatory process diagrams of a fine pattern forming method in accordance with the preferred embodiment of the present invention.

A cross sectional view of the wafer W, which has been subjected to the photolithography processing, is shown in FIG. 3A. As illustrated in FIG. 3A, in the mask layer 76 patterned through the photolithography processing, there are formed spaces 80 having a predetermined width (L). The width (L) of each space 80 is, e.g., about 130 nm.

Thus, in the first process, a process condition is set such that plasma reaction products are deposited on a sidewall of the mask layer 76 which has been previously patterned in the photolithography processing, to thereby increase the pattern width of the mask layer 76. In this case, the process condition is set such that the pattern width is increased to such a degree that the width (L) of each space 80, formed between the respective patterns of the mask layer 76 has a desired length at the end of the first process. Specific process conditions in the first process are described below. Further, in the first process, the antireflection film 75 disposed under the mask layer 76 is hardly etched.

Processing gas: $CHF_3$ (flow rate: 200 sccm);
Inner pressure of the chamber: 10 mTorr;
High frequency power applied to the upper electrode: 200 W;
High frequency power applied to the lower electrode: 100 W;
He gas pressure (center/edge): 3/3 Torr;
Temperature in the chamber (top/wall/bottom): 80/60/30° C.; and
Processing (deposition) time: 185 sec.

Figure 3B:
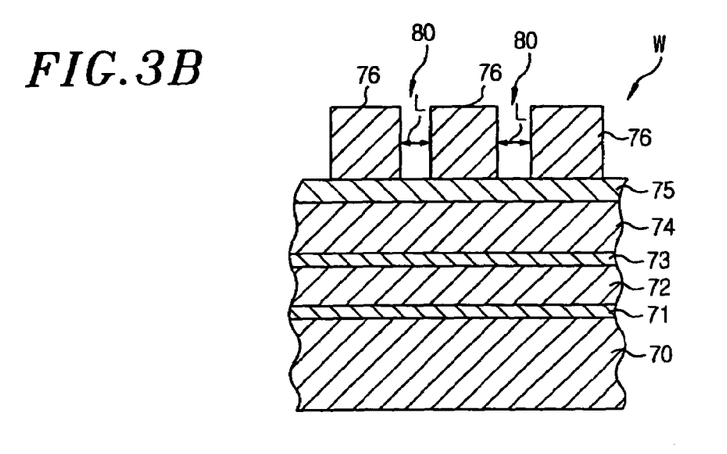

By carrying out the first process under the aforementioned process conditions, the plasma reaction products are deposited on the sidewalls of the mask layer 76, allowing the pattern width of the mask layer 76 to be increased as depicted in FIG. 3B, and the width (L) of each space 80 formed between the respective patterns of the mask layer 76 to be narrowed down to, e.g., about 50 nm.

Further, the processing time (185 sec) of the first process may be determined on the basis of the process described below. Namely, a pattern width (an initial value) of the mask layer is measured in advance by using a wafer sample having the same film layer structure. Subsequently, the first process is carried out for a predetermined time under the same conditions, and then, the process is stopped to measure the pattern width of the mask layer thereat. Then, a difference between the measured pattern width and the initial value is obtained. Further, by calculating a rate of increase in the pattern width of the mask layer (a slope of a pattern width/time) based on the difference in the pattern width and the processing time, the width (L) of each space 80 formed between the respective patterns of the mask layer 76 can be adjusted depending on the rate of increase thereof. Further, by changing various process parameters, the processing time (the time for the first process) can be adjusted.

However, in the photolithography processing, if the line-and-space pattern is formed on the mask layer 76 made of the photoresist material, the end of the line (sidewall portion) may not be a perfect straight line and a roughness (wave) may slightly be generated therein, resulting in a line edge roughness (LER). LER is commonly as small as about several nm, but it may not become negligible if the miniaturization of the pattern progresses. For manufacturing high-performance and ultra fine semiconductor devices, LER needs to be reduced. In accordance with the present embodiment, the end of the line may become more flattened as a consequence of the increased pattern width of the mask layer 76 in the first process.

As mentioned above, at the end of the first process, the pattern width of the mask layer 76 increases, so that the width (L) of each space 80 formed between the respective patterns of the mask layer 76 narrows down to e.g., about 50 nm, and the LER is also reduced. Further, in the subsequent second process, the antireflection film 75 and the first etching target layer 74 are etched by using as a mask the mask layer 76 having such a pattern width.

Figure 3C:
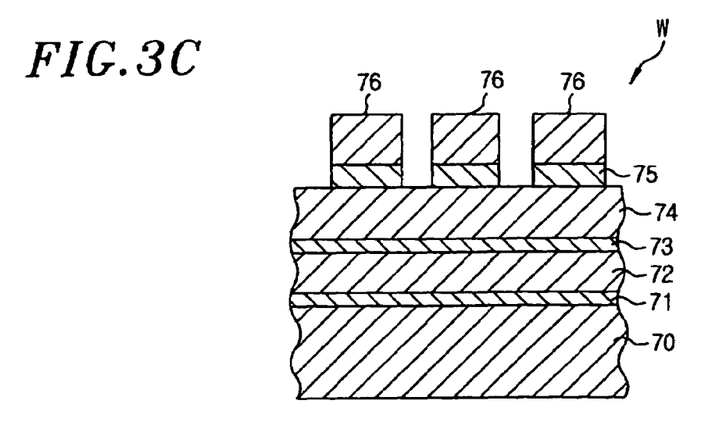
Figure 3D:
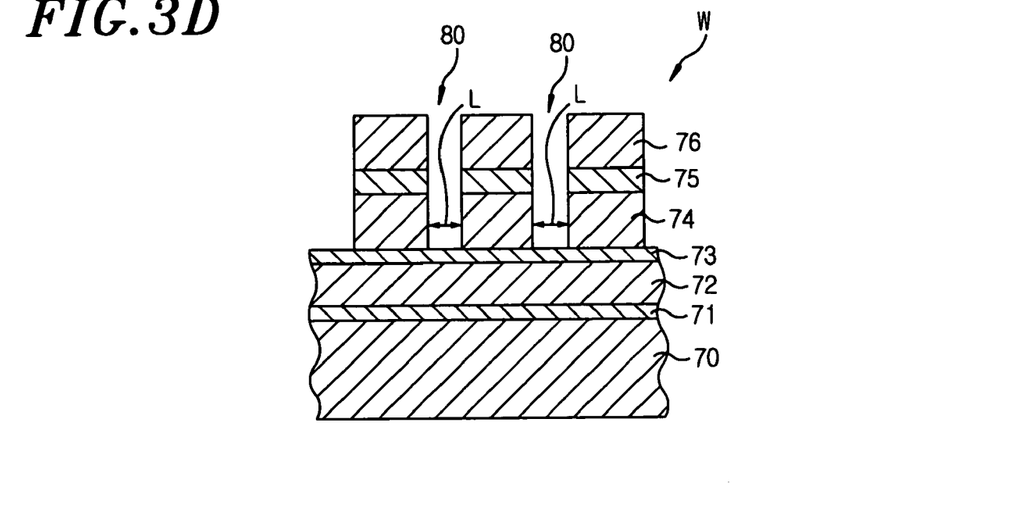

In the second process, the antireflection film 75 formed under the mask layer 76 is first etched by using as a mask the mask layer 76 as shown in FIG. 3C, the pattern width of the mask layer 76 having been increased in the aforementioned first process; and, thereafter, the first layer 74 is etched as shown in FIG. 3D. Exemplary specific process conditions for etching the antireflection film 75 are as follows:

Processing gas: $CF_4$ (flow rate 40 sccm)+$O_2$ (flow rate 40 sccm);
Inner pressure of chamber: 20 mTorr;
High frequency power applied to upper electrode: 600 W; and
High frequency power applied to lower electrode: 100 W.

In the second process, after the exposure of the first etching target layer 74 serving as a under layer of the antireflection layer 75 is detected, the first etching target layer 74 is subsequently etched. Exemplary specific process conditions in case when the first etching target layer 74 is polycrystalline silicon are as follows:

processing gas: HBr (flow rate 40 sccm)+$O_2$ (flow rate 2 sccm);
Inner pressure of chamber: 30 mTorr;
High frequency power applied to upper electrode: 200 W;
High frequency power applied to lower electrode: 150 W.

If the second process is performed under the aforementioned process conditions, the spaces 80 that have been narrowed down to, e.g., about 50 nm in width (L) reach to the first etching target layer 74, and therefore, the first etching target layer 74 is patterned to have the same width (L), as shown in FIG. 3D.

Figure 3E:
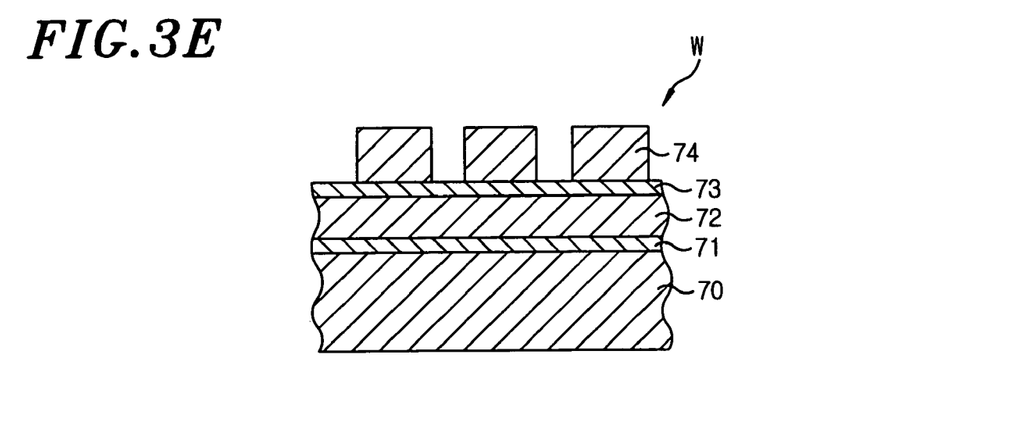
Figure 3F:
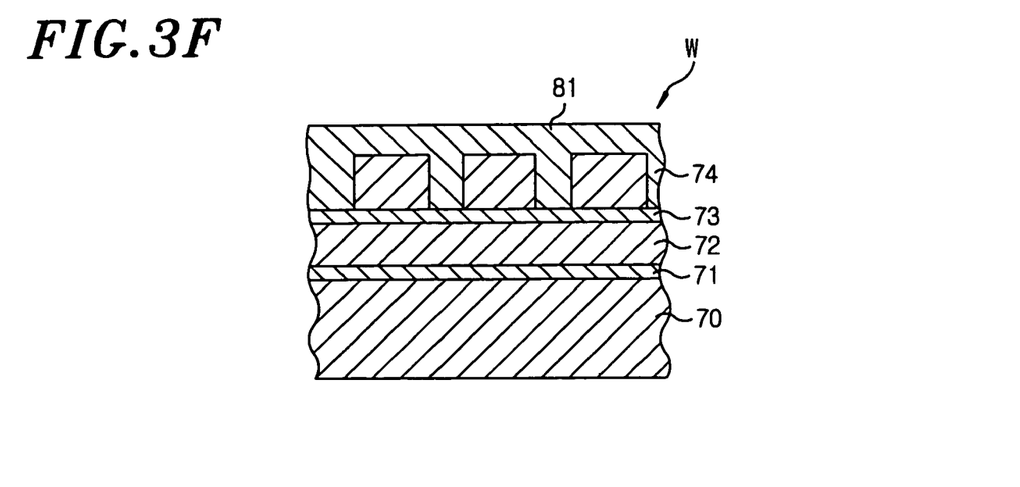
Figure 3G:
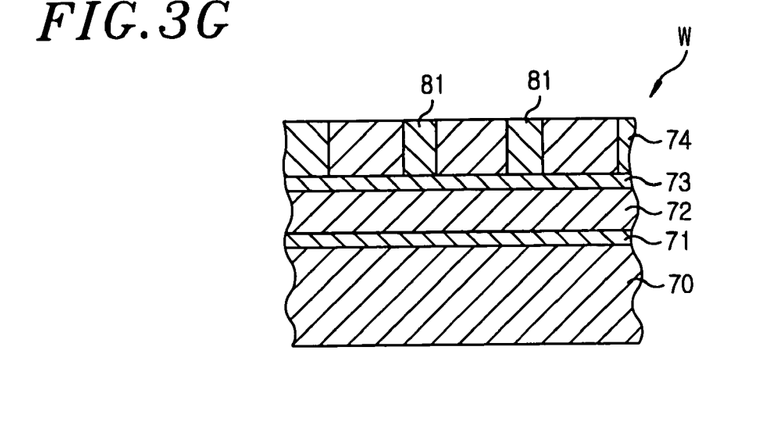

Next, in the third process, the spaces 80 that have been etched to reach the first etching target layer 74 are filled with a mask material. In the third process, an ashing process is performed in advance to remove the mask layer 76 and the antireflection layer 75, as shown in FIG. 3E. In this way, the first etching target layer 74 is exposed; and then, the mask material 81 is deposited over the entire wafer W to cover the first etching target layer 74 as shown in FIG. 3F, thereby, filling the space 80 formed between the respective patterns of the first layer 74 with the mask material 81. Thereafter, the mask material 81 covering the top surface of the first layer 74 is removed by performing a CMP processing or an etch-back processing, to expose the first etching target layer 74 as shown in FIG. 3G. In the third process, a deposit employed as the mask material 81 may be, e.g., a silicon oxide film, which is deposited by using a plasma CVD method using TEOS (TetraEthyl OrthoSilicate) and oxygen, or an atmospheric pressure CVD method using TEOS and ozone. Further, a silicon nitride film may also be deposited in lieu of the silicon oxide film.

Figure 3H:
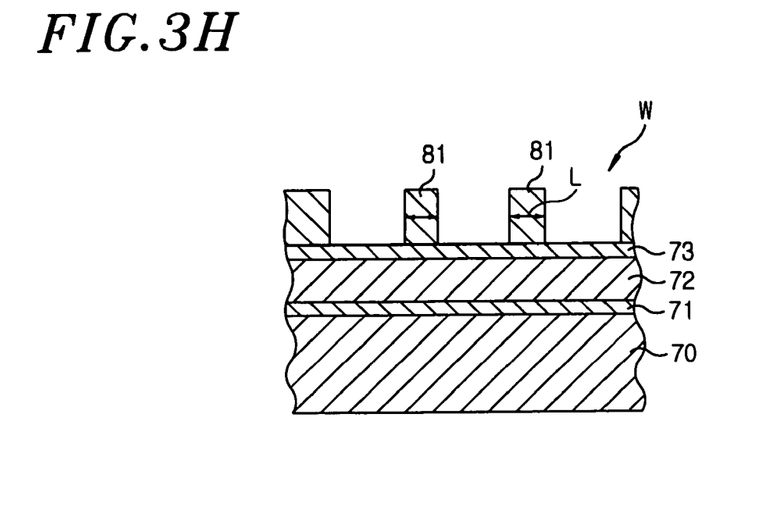

Next, in the fourth process, the first etching target layer 74 is etched, leaving behind the mask material 81 that filled the spaces 80 formed in the first etching target layer 74, as shown in FIG. 3H. In this way, the first layer 74 is etched, and only the mask material 81, the width (L) of which has been narrowed down to, e.g., about 50 nm, remains on the etch-stop layer 73. Further, in the fourth process, exemplary specific etching conditions in case where the first etching target layer 74 is polycrystalline silicon are as follows:

Processing gas: HBr (flow rate 400 sccm)+$O_2$ (flow rate 2 sccm);

Inner pressure of chamber: 30 mTorr;

High frequency power applied to upper electrode: 200 W; and

High frequency power applied to lower electrode: 150 W.

Figure 3I:
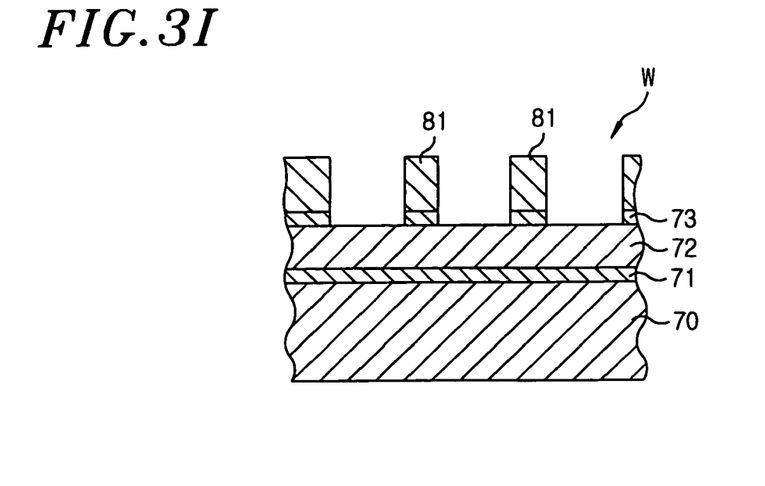
Figure 3J:
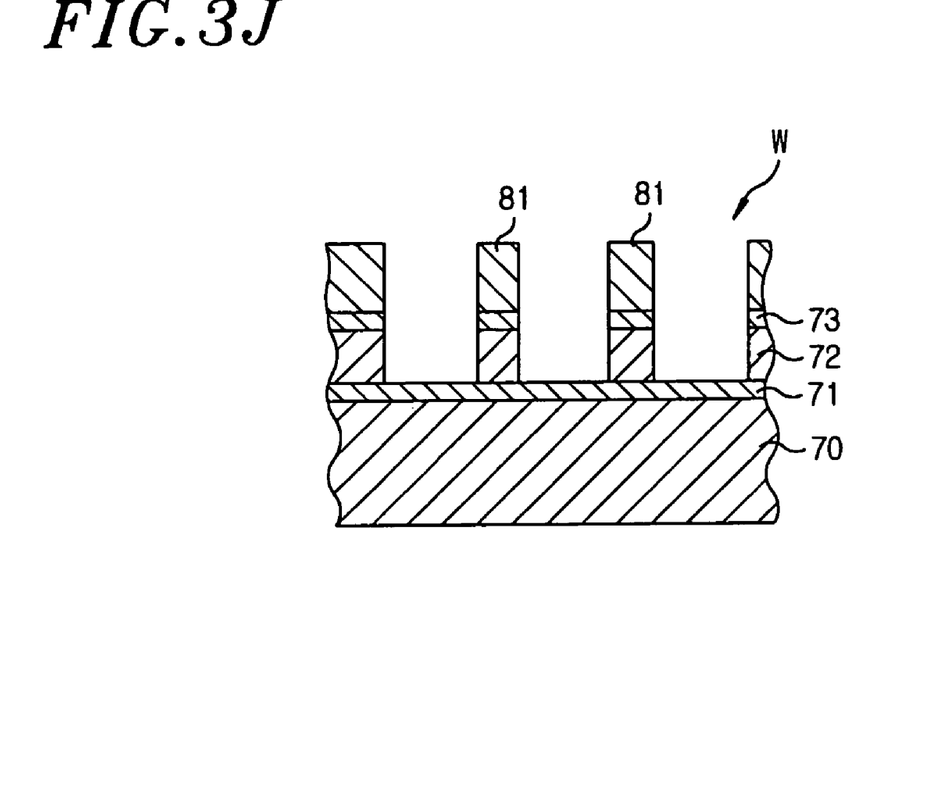

In the next fifth process, the second etching target layer 72 is etched by using as a mask the mask material 81, remaining on the etch-stop layer 73. In this case, the etch-stop layer 73 is first etched to be removed by using as a mask the mask material 81 remaining thereon as shown in FIG. 3I; and subsequently, the second etching target layer 72 is etched as shown in FIG. 3J. Exemplary specific etching conditions in case where the etch-stop layer 73 is formed of a silicon oxide film are as follows:

Processing gas: $C_4F_8$ (flow rate 20 sccm)+Ar (flow rate 400 sccm);

Inner pressure of chamber: 50 mTorr;

High frequency power applied to upper electrode: 600 W; and

High frequency power applied to lower electrode: 500 W.

In the fifth process, after exposing the second etching target layer 72 employed as an under layer of the etch-stop layer 73, the second etching target layer 72 is then etched. Exemplary specific etching conditions in case where the second etching target layer 72 is formed of polycrystalline silicon are as follows:

Processing gas: HBr (flow rate 400 sccm)+$O_2$ (flow rate 2 sccm);

Inner pressure of chamber: 30 mTorr;

High frequency power applied to upper electrode: 200 W; and

High frequency power applied to lower electrode: 150 W.

In the fifth process, the etching is carried out by using as a mask the mask material 81, the width (L) of which has been narrowed down to, e.g., about 50 nm, so that each of the etch-stop layer 73 and the second etching target layer 72 can be patterned to have the same width (L) of, e.g., about 50 nm, as the mask.

Figure 3K:
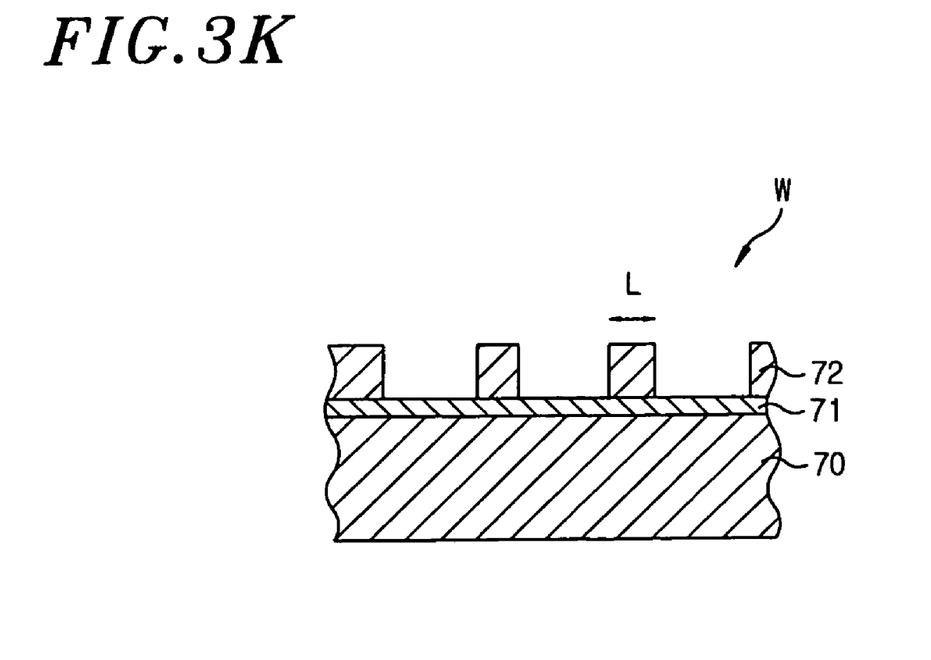

Next, in the sixth process, an ashing process is performed to remove the mask material 81 and the etch-stop layer 73. In this way, only the patterned second etching target layer 72, the width (L) of which has been narrowed down to, e.g., about 50 nm, remains on the insulating layer 71 as shown in FIG. 3K.

As described above, in accordance with the fine pattern forming method of the present embodiment, the second etching target layer 72 can be patterned to have a narrow gap of, e.g., about 50 nm, even though the width (L) of the spaces 80 formed on the mask layer 76 through the patterning by the photolithography processing is, e.g., about 130 nm. As mentioned above, the formation of the fine pattern having more superior resolution than critical resolution in the photolithography processing becomes possible. By employing such a fine pattern forming method, it is possible to realize a microprocessing of about 20 nm wide CD, even in a case where a gate of, e.g., MOSFET semiconductor device is formed.

Further, in accordance with the fine pattern forming method, even though there is a difference in the pattern width of the mask layer 76, which has been patterned by using the photolithography technology, it is possible to remove the difference and form a uniform circuit over the entire wafer W. Thus, it is advantageously employed for forming a fine wiring circuit as well as the gate of MOSFET.

Heretofore, the preferred embodiment of the present invention has been exemplified with reference to the accompanying drawings, but the present invention is not limited to the aforementioned embodiment. It will be understood by those skilled in the art that various changes and modifications may be made without departing from the scope of the invention as defined in the following claims.

For example, in the aforementioned embodiment, the antireflection layer 75 is disposed under the mask layer 76 to suppress the light beam from being reflected from the under layer during the exposure of the mask layer 76, and thus, finely patterning the mask layer 76. However, the antireflection layer 75 may be omitted. In that case, in the second process, the process for etching the antireflection layer 75 can be omitted. Further, an example of embedding the etch-stop layer 73 between the first and the second etching target layer 74 and 72 has been described, but the etch-stop layer 73 may be omitted by properly selecting materials thereof. In that case, in the fifth process, the process for etching the etch-stop layer 73 may be omitted. For example, if the first etching target layer 74 is formed of a low dielectric constant film material so-called, a low-k film material and the second etching target layer 72 is formed of polycrystalline silicon, the etch-stop layer 73 may be omitted. As for the low dielectric constant film material, there may be enumerated SiOF (SFG) based, SiOC (Carbon-doped $SiO_2$) based, or siloxane (Si—O—Si) based HSQ (Hydrogen-SilsesQuioxane) or MSQ (Methyl-hydrogen-SilsesQuioxane). Further, an organic material other than siloxane-based material may be adopted. In case where the first layer 74 is formed of a low-k film material and the second etching target layer 72 is formed of polycrystalline silicon as mentioned above, amorphous carbon may be used as a mask material filling the spaces 80.

Further, $CHF_3$ gas has been used as a processing gas in the first process, but the present invention is not limited thereto. Other CHF based gas, CF based gas, CH based gas or the like may be used as a processing gas. Namely, there may be used other processing gas as long as it deposits the reaction products on the sidewalls of the mask layer 76.

While the invention has been shown and described with respect to the preferred embodiments, it will be understood by those skilled in the art that various changes and modifications may be made without departing from the scope of the invention as defined in the following claims.

What is claimed is:

1. A fine pattern forming method, comprising:
   the first step of depositing a plasma reaction products on a sidewall of a patterned mask layer to increase a pattern width thereof;
   the second step of etching a first etching target layer by using as a mask the mask layer, the pattern width of which has been increased;
   the third step of filling with a mask material a space formed in the etched first etching target layer;
   the fourth step of etching the etched first etching target layer leaving the mask material filling the space; and
   the fifth step of etching a second etching target layer by using a remaining mask material as a mask.

2. The fine pattern forming method of claim 1, wherein the mask layer is formed of a photoresist material.

3. The fine pattern forming method of claim 1, wherein a processing gas in the first step is any one of CF based gas, CHF based gas, and CH based gas.

4. The fine pattern forming method of claim 1, wherein a width of the space is 50 nm or less.

5. The fine pattern forming method of claim 1, wherein, in the second step, an antireflection layer formed under the mask layer is etched, and then, the first etching target layer is etched.

6. The fine pattern forming method of claim 1, wherein, in the third step, a deposit is formed to cover the first etching target layer, and then, the first etching target layer is exposed by a CMP processing or an etchback processing.

7. The fine pattern forming method of claim 1, wherein, in the third step, the mask material filling the space is a different material from the first etching target layer.

8. The fine pattern forming method of claim 1, wherein the first etching target layer is formed of the same material as the second etching target layer; and an etch-stop layer is formed between the first and the second etching target layer.

9. The fine pattern forming method of claim 8, wherein, in the fifth step, the etch-stop layer formed under the first etching target layer is removed, and then, the second etching target layer is etched.

10. The fine pattern forming method of claim 8, wherein each of the first and the second etching target layer is formed of polycrystalline silicon, and the etch-stop layer is formed of a silicon oxide film or a silicon nitride film.

11. The fine pattern forming method of claim 1, wherein the first etching target layer is formed of a low dielectric constant film material, the second etching target layer is formed of polycrystalline silicon, and the mask material is formed of amorphous carbon.

12. The fine pattern forming method of claim 1, further comprising the sixth step of removing the mask material, after the fifth step.

* * * * *